(12) United States Patent
Yang et al.

(10) Patent No.: US 12,388,227 B2
(45) Date of Patent: Aug. 12, 2025

(54) WIRE MODULE AND MANUFACTURING METHOD THEREOF

(71) Applicant: ELKA INTERNATIONAL LTD., New Taipei (TW)

(72) Inventors: Jui-Ming Yang, New Taipei (TW); Youyuan Deng, New Taipei (TW)

(73) Assignee: ELKA INTERNATIONAL LTD., New Taipei (TW)

( * ) Notice: Subject to any disclaimer, the term of this patent is extended or adjusted under 35 U.S.C. 154(b) by 336 days.

(21) Appl. No.: 18/142,763

(22) Filed: May 3, 2023

(65) Prior Publication Data

US 2024/0222923 A1 Jul. 4, 2024

(30) Foreign Application Priority Data

Dec. 30, 2022 (TW) .................................. 111150957

(51) Int. Cl.
*H01R 12/00* (2006.01)
*H01R 12/53* (2011.01)
*H01R 43/02* (2006.01)
*H05K 1/18* (2006.01)

(52) U.S. Cl.
CPC ......... *H01R 43/0263* (2013.01); *H01R 12/53* (2013.01); *H05K 1/18* (2013.01); *H05K 2201/09027* (2013.01); *H05K 2201/10189* (2013.01); *H05K 2201/10356* (2013.01)

(58) Field of Classification Search
CPC ....... H01R 12/53; H01R 43/0236; H05K 1/18
See application file for complete search history.

(56) References Cited

U.S. PATENT DOCUMENTS

| | | | | |
|---|---|---|---|---|
| 8,840,321 B2* | 9/2014 | Wu | ........................ | H01R 24/60 385/89 |
| 9,397,435 B2* | 7/2016 | Xing | ..................... | H01R 13/504 |
| 9,590,363 B2* | 3/2017 | Wu | ..................... | H01R 13/6585 |
| 9,705,241 B2* | 7/2017 | Wu | ..................... | H01R 13/5845 |
| 10,777,954 B2 | 9/2020 | Wu et al. | | |
| 2016/0079689 A1* | 3/2016 | Wu | ......................... | B23K 26/32 228/180.21 |

(Continued)

FOREIGN PATENT DOCUMENTS

CN 2927374 Y 7/2007

*Primary Examiner* — Phuong Chi Thi Nguyen
(74) *Attorney, Agent, or Firm* — Birch, Stewart, Kolasch & Birch, LLP

(57) ABSTRACT

A wire module is disclosed, which includes a wire group and a wire-distributing device. The wire group has a plurality of wires. The wire-distributing device includes a first wire-distributing module and a second wire-distributing module. The first wire-distributing module has a first wire-distributing member and a first sectional surface. The first sectional surface is located on the surface of one end of the first wire-distributing member, and the first part of the plurality of wires is positioned side by side on the first wire-distributing member. The second wire-distributing module has similar structures and configurations to the first wire-distributing module, wherein the first wire-distributing module is stacked on the second wire-distributing module, and the first sectional surface and the second sectional surface are correspondingly located on the same side.

20 Claims, 15 Drawing Sheets

(56) References Cited

U.S. PATENT DOCUMENTS

| | | | |
|---|---|---|---|
| 2016/0093987 A1* | 3/2016 | Wu | H01R 13/72 |
| | | | 439/620.22 |
| 2017/0187150 A1* | 6/2017 | Fabre | H01R 13/6593 |
| 2018/0001407 A1* | 1/2018 | Wu | H01R 24/60 |
| 2018/0131126 A1 | 5/2018 | Wang et al. | |

* cited by examiner

900

S910: Sorting a plurality of wires into a first part and a second part.

S920: Fixing the first part of the plurality of wires to a first wire distributing module, and fixing the second part of the plurality of wires to a second wire distributing module, wherein one end of the first wire distributing module has at least one first aligning-coupling portion, and one end of the second wire distributing module has at least one second aligning-coupling portion.

S930: Forming the wire module with the first wire distributing module and the second wire distributing module, wherein the first aligning-coupling portion is correspondingly combined with the second aligning-coupling portion to position a relative location of the first wire distributing module and the second wire distributing module.

S940: Soldering the first part and the second part of the plurality of wires to a circuit board.

S950: After soldering the first part and the second part of the plurality of wires to the circuit board, the first aligning-coupling portion and the second aligning-coupling portion are selectively removed to expose a corresponding sectional surface.

FIG. 15

WIRE MODULE AND MANUFACTURING METHOD THEREOF

CROSS-REFERENCE TO RELATED APPLICATION

This application claims the priority benefits of Taiwan patent application No. 111150957, filed on Dec. 30, 2022. The entirety of the abovementioned patent application is hereby incorporated by reference herein and made a part of this specification.

BACKGROUND OF THE INVENTION

1. Field of the Invention

The present invention relates to a wire module. Specifically, the present invention relates to a wire module having a wire-distributing device.

2. Description of the Prior Art

When a wire module is processed and soldered, different types of wires require different pre-treatments, such as using lasers with different wavelengths to remove the outer layer of a wire module. Furthermore, along with factors such as changes in connection interfaces, the increase in the number of wires, the decrease in wire pitch, and the limitation of circuit board size, the difficulty in processing is increased, resulting in longer processing time and poor quality of the wire assembly.

SUMMARY OF THE INVENTION

To solve the technical problems, an embodiment of the present invention provides a wire module that includes a wire group and a wire-distributing device. The wire group includes a plurality of wires. The wire-distributing device includes a first wire-distributing module and a second wire-distributing module. The first wire-distributing module has a first wire-distributing member and at least one first aligning-coupling portion connected to one end of the first wire-distributing member. The first part of the plurality of wires is positioned side by side on the first wire-distributing member. The second wire-distributing module has a second wire-distributing member and at least one second aligning-coupling portion connected to one end of the second wire-distributing member. A second part of the plurality of wires is positioned side by side on the second wire-distributing member. The first wire-distributing module is stacked on the second wire-distributing module, and the first wire-distributing member and the second wire-distributing member are relatively positioned by combining the first aligning-coupling portion and the corresponding second aligning-coupling portion.

Another embodiment of the present invention provides a wire module that includes a wire group and a wire-distributing device. The wire group has a plurality of wires. The wire-distributing device includes a first wire-distributing module and a second wire-distributing module. The first wire-distributing module has a first wire-distributing member and a first sectional surface located on the surface of one end of the first wire-distributing member. The first part of the plurality of wires is positioned side by side on the first wire-distributing member. The second wire-distributing module has a second wire-distributing member and a second sectional surface located on the surface of one end of the second wire-distributing member. A second part of the plurality of wires is positioned side by side on the second wire-distributing member. The first wire-distributing module is stacked on the second wire-distributing module, and the first sectional surface and the corresponding second sectional surface are located on the same side.

An embodiment of the present invention also provides a manufacturing method for a wire module. The method may include sorting a plurality of wires into a first part and a second part. The method may include fixing the first part of the plurality of wires to a first wire-distributing module and fixing the second part of the plurality of wires to a second wire-distributing module. One end of the first wire-distributing module has at least one first aligning-coupling portion, and one end of the second wire-distributing module has at least one second aligning-coupling portion. The method may include forming a wire module with the first wire-distributing module and the second wire-distributing module. The first aligning-coupling portion is combined with the corresponding second aligning-coupling portion to fix the positions of the first wire-distributing module and the second wire-distributing module relative to each other.

An embodiment of the present invention has the following technical effects for prior art. An embodiment of the present invention may sort a plurality of wires into different groups (for example, an upper layer and a lower layer), and then perform different pre-treatments (for example, using lasers with different wavelengths to remove the outer layer of the wires). Therefore, the technical problems of poor quality of the wire assembly caused by a large number of wires, wires with a smaller pitch, and the smaller size of a circuit board may be improved.

BRIEF DESCRIPTION OF THE DRAWINGS

In order to make the abovementioned and other purposes, features, advantages, and embodiments of the present invention more clearly understood, the accompanying drawings are described as follows:

FIG. 15 is a schematic flowchart of a manufacturing method of a wire module according to an embodiment of the present invention.

DETAILED DESCRIPTION OF THE PREFERRED EMBODIMENT

Figure 1:
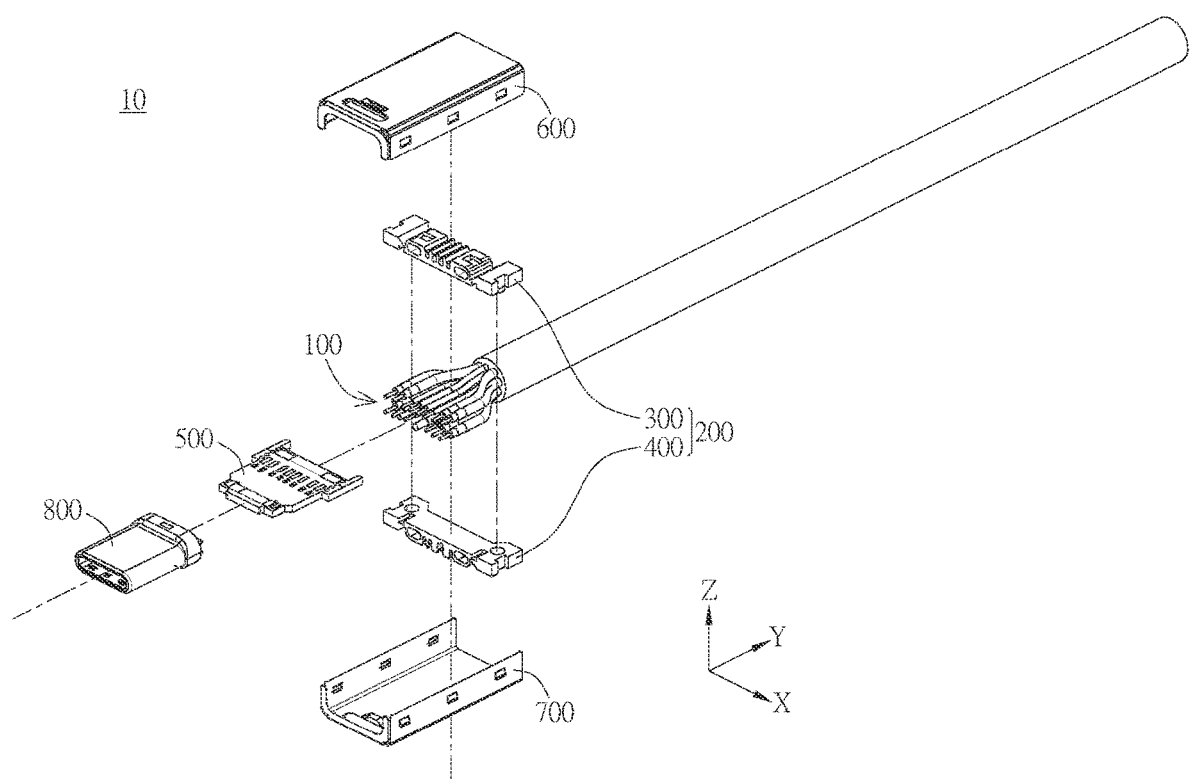
FIG. 1 is an exploded diagram of a wire module according to an embodiment of the present invention.

Various embodiments will be described in the specification, and a person having ordinary skill in the art may easily understand the spirit and the principles of the present invention by referring to the specifications and the drawings. Here, each element, or part, shown in each drawing may be exaggerated or changed for clarity. Therefore, a person having ordinary skill in the art should understand that the size and the relative ratio of each element or part shown in the drawings are not the actual sizes and relative ratios of the actual element or part. Additionally, although some specific embodiments have been described in detail herein, these embodiments are intended to be illustrative only and are not to be considered in a limiting or exhaustive sense in all respects. Therefore, various changes and modifications to the present invention should be apparent to and may be easily accomplished by a person ordinarily skilled in the art without departing from the spirit and principles of the present invention.

It should be noted that although the terms "first", "second", "third" and the like may be used herein to describe various elements, components, regions, layers, and/or sections, these elements, components, regions, layers and/or sections shall not be limited by these terms. These terms are only used to distinguish one element, component, region, layer, and/or section from another element, component, region, layer, and/or section. Therefore, a "first element", "component", "region", "layer" and/or "section" discussed below could be termed a second element, component, region, layer, and/or section without departing from the teachings herein.

Figure 2:
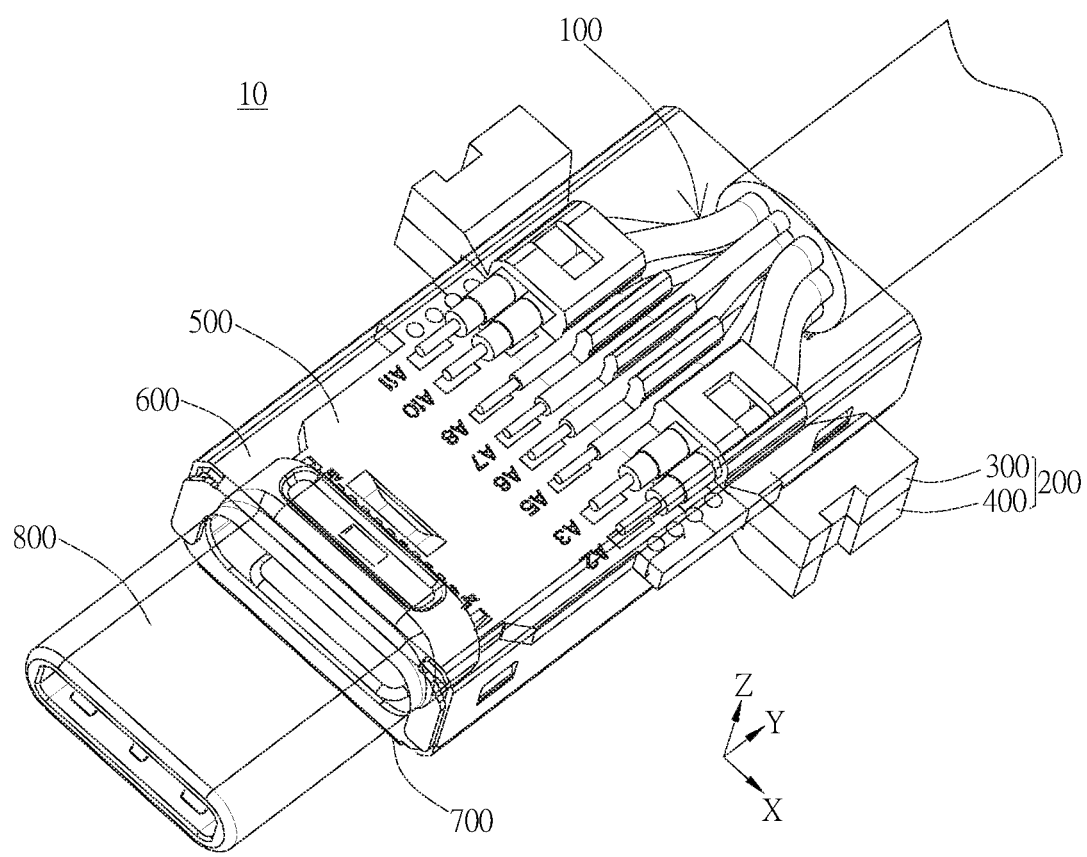
FIG. 2 is a partially enlarged three-dimensional schematic diagram of the assembled wire module according to an embodiment of the present invention.

Referring to FIG. 1 and FIG. 2, FIG. 1 is an exploded diagram of a wire module according to an embodiment of the present invention, and FIG. 2 is a partially enlarged three-dimensional schematic diagram of the assembled wire module according to an embodiment of the present invention. As shown in FIG. 1, an embodiment of the present invention provides a wire module 10 which includes a wire group 100, a wire-distributing device 200 having a first wire-distributing module 300, and a second wire-distributing module 400, a circuit board 500, an upper housing 600, a lower housing 700, and a wire connector 800. The plurality of wires of the wire group 100 are sorted into different groups and positioned by the first wire-distributing module 300 and the second wire-distributing module 400 of the wire-distributing device 200. The plurality of wires may be soldered to the circuit board 500 after sorting and positioning, and the wire connector 800 may be soldered to the circuit board 500, wherein the detailed structures of each element will be described in the following paragraphs of the specification with drawings.

Figure 3:
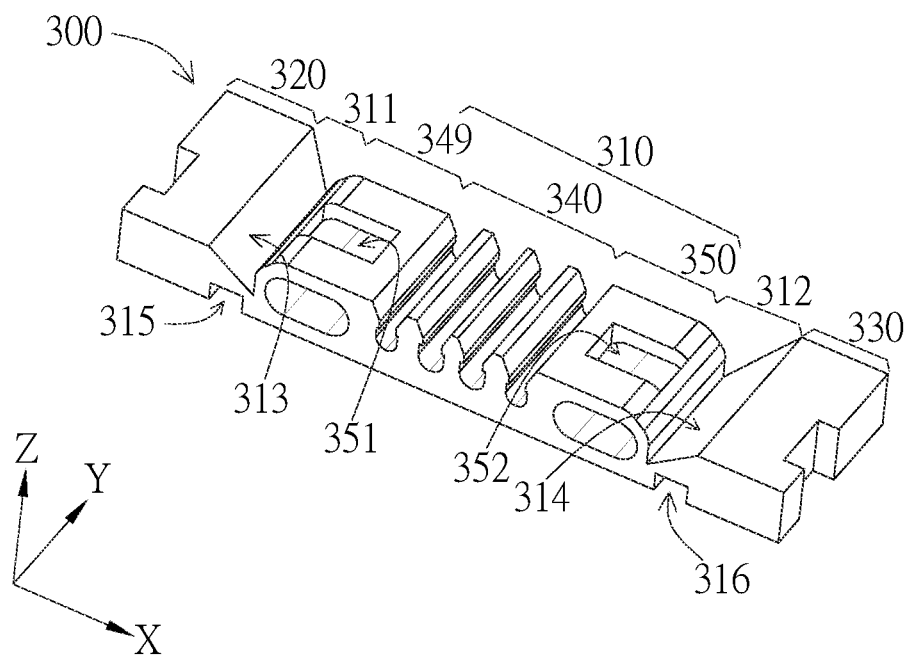
FIG. 3 is a three-dimensional schematic diagram of a first wire-distributing module at a first angle according to an embodiment of the present invention.
Figure 4:
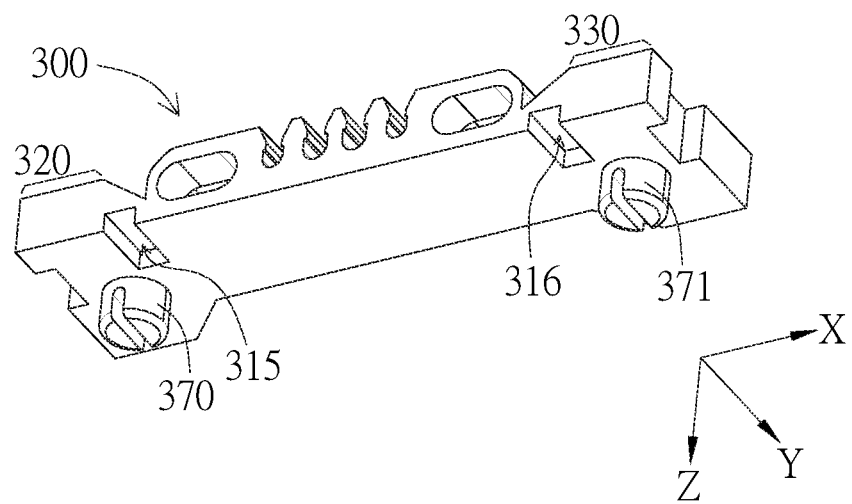
FIG. 4 is a three-dimensional schematic diagram of a first wire-distributing module at a second angle according to an embodiment of the present invention.

Referring to FIG. 3 and FIG. 4, FIG. 3 is a three-dimensional schematic diagram of a first wire-distributing module at a first angle according to an embodiment of the present invention, and FIG. 4 is a three-dimensional schematic diagram of a first wire-distributing module at a second angle according to an embodiment of the present invention. As shown in FIG. 3, the first wire-distributing module 300 in the wire-distributing device 200 has a first wire-distributing member 310, and the first wire-distributing member 310 has two ends along the X-axis direction. The left end 311 connects to a first aligning-coupling portion 320, and the right end 312 connects to a first aligning-coupling portion 330. The detailed structures of the first wire-distributing member 310 may include a first wire-distributing grooves 340, a first wire-distributing tube 349, and a first wire-distributing tube 350. The first wire-distributing tube 349 on the left is disposed between the first wire-distributing grooves 340 and the first aligning-coupling portion 320, and the first wire-distributing tube 350 on the right is disposed between the first wire-distributing grooves 340 and the first aligning-coupling portion 330.

Part of the wires of the wire group 100 may be positioned in the aforementioned first wire-distributing grooves 340 side by side along the Y-axis direction as shown in FIG. 3. For example, the first wire-distributing grooves 340 may be unclosed grooves as shown in FIG. 3, and the shape of each the groove matches the shape of the corresponding wire. Some wires of the wire group 100 may be allowed to pass through the first wire-distributing tube 349 and the first wire-distributing tube 350. For example, the first wire-distributing tube 349 and the first wire-distributing tube 350 may be ring-shaped tubes as shown in FIG. 3, and the diameter of the ring-shaped tubes may be larger than the diameter of the wires positioned side by side in the first wire-distributing grooves 340. An adhesive injection hole is respectively disposed on the surface of the first wire-distributing tube 349 and the surface of the first wire-distributing tube 350 facing away from the second wire-distributing module 400. For example, an adhesive injection hole 351 is disposed on the first wire-distributing tube 349 on the left, and an adhesive injection hole 352 is disposed on the first wire-distributing tube 350 on the right, to inject adhesive to fix the wires passing through the first wire-distributing tube 349 and the first wire-distributing tube 350. Therefore, when wire module 10 is in the subsequent processing processes, the relative positions between the wires will not be changed and the processing quality will not be affected. The detailed configurations of the first wire-distributing module 300 and the wire group 100 will be described in the following paragraphs with FIG. 10 and FIG. 11.

Moreover, the detailed structures between the first wire-distributing member 310 and the first aligning-coupling portion may include a pre-cut groove. For example, a pre-cut groove is disposed between the first wire-distributing tube 349 on the left and the first aligning-coupling portion 320. That is, the end 311 may include the pre-cut groove 313 for the remove of the first aligning-coupling portion 320 of the assembled wire module 10. Similarly, a pre-cut groove is disposed between the first wire-distributing tube 350 on the right and the first aligning-coupling portion 330. That is, the end 312 may include the pre-cut groove 314 for the remove of the first aligning-coupling portion 330 of the assembled wire module 10.

In addition, the first wire-distributing module 300 is provided with a positioning groove on the surface opposite to the adhesive injection hole. That is, one side of the first wire-distributing member 310 is provided with a positioning groove toward the second wire-distributing module 400. For example, a region of the left end 311 of the bottom surface of the first wire-distributing module 300 is provided with a positioning groove 315, and a region of the right end 312 of the bottom surface of the first wire-distributing module 300 is provided with a positioning groove 316. The positioning groove 315 and the positioning groove 316 are used for fixing the position of the aforementioned circuit board 500. When the aforementioned wire group 100 is soldered to the circuit board 500, the relative position between each wire and the circuit board 500 will not be changed and the processing quality will not be affected. The detailed configurations of the wire group 100, the first wire-distributing module 300, and the circuit board 500 will be described in the following paragraphs in FIG. 12 and FIG. 13.

Furthermore, the first aligning-coupling portion of the first wire-distributing module 300 can be provided with a coupling portion to couple the first wire-distributing module 300 and the second wire-distributing module 400 together to fix their positions relative to each other. For example, the coupling portion 370 can be disposed of on the bottom surface of the first aligning-coupling portion 320 toward the second wire-distributing module 400, and the coupling portion 371 can be disposed of on the bottom surface of the first aligning-coupling portion 330 toward the second wire-distributing module 400. The structures of the second wire-distributing module 400 corresponding to the coupling portion 370 and the coupling portion 371 will be described in FIG. 5 to FIG. 8.

Figure 5:
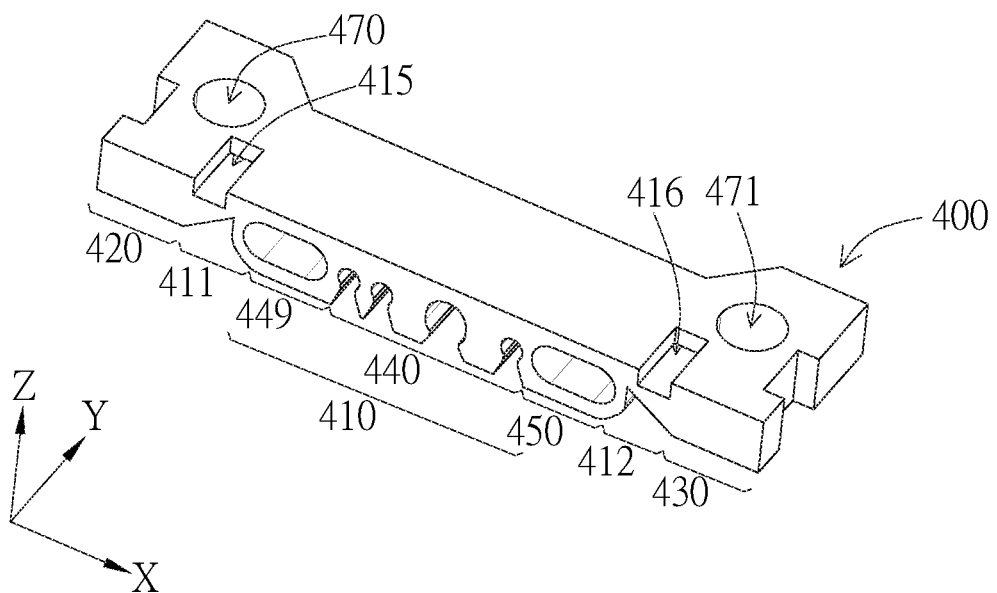
FIG. 5 is a three-dimensional schematic diagram of a second wire-distributing module at a first angle according to an embodiment of the present invention.
Figure 6:
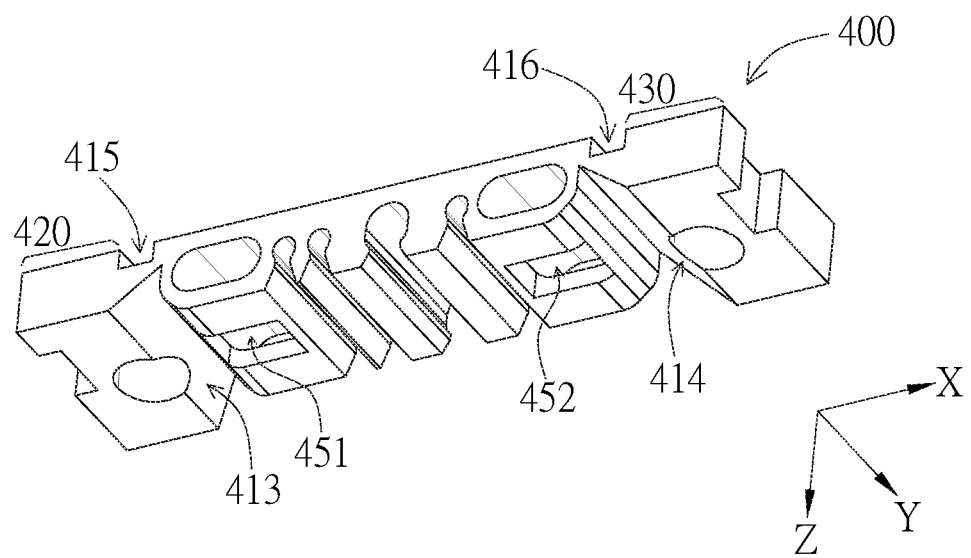
FIG. 6 is a three-dimensional schematic diagram of a second wire-distributing module at a second angle according to an embodiment of the present invention.

Referring to FIG. 5 and FIG. 6, FIG. 5 is a three-dimensional schematic diagram of a second wire-distributing module at a first angle according to an embodiment of the present invention, and FIG. 6 is a three-dimensional schematic diagram of a second wire-distributing module at a second angle according to an embodiment of the present invention. As shown in FIG. 5, the second wire-distributing module 400 in the wire-distributing device 200 has a second wire-distributing member 410, and the second wire-distributing member 410 has two ends along the X-axis direction. The left end 411 connects to a second aligning-coupling portion 420, and the right end 412 connects to a second aligning-coupling portion 430. The detailed structures of the second wire-distributing member 410 may include a second wire-distributing groove 440, a second wire-distributing tube 449, and a second wire-distributing tube 450. The second wire-distributing tube 449 on the left is disposed between the second wire-distributing grooves 440 and the second aligning-coupling portion 420, and the second wire-distributing tube 450 on the right is disposed between the second wire-distributing grooves 440 and the second aligning-coupling portion 430.

Similarly, part of the wires of wire group 100 may be positioned in the second wire-distributing grooves 440 side by side along the Y-axis direction as shown in FIG. 5, and part of the wires of wire group 100 may pass through the second wire-distributing tube 449 and the second wire-distributing tube 450 along the Y-axis direction. It should be noted that the direction of the second wire-distributing groove 440 of the second wire-distributing member 410 is configured to be opposite to the direction of the first wire-distributing groove 340 of the first wire-distributing member 310. In other words, the Z-axis direction of FIG. 3 is opposite to the Z-axis direction of FIG. 5.

Next, an adhesive injection hole may also be provided on the surface of the second wire-distributing tube 449 and a surface of the second wire-distributing tube 450 facing away from the first wire-distributing module 300. For example, an adhesive injection hole 451 is disposed on one side of the second wire-distributing tube 449 on the left toward the negative Z-axis, and an adhesive injection hole 452 is disposed on one side of the second wire-distributing tube 450 on the right toward the negative Z-axis, to inject the adhesive to fix the wires passing through the second wire-distributing tube 449 and the second wire-distributing tube 450. Therefore, when wire module 10 is in the subsequent processing processes, the relative positions between the wires will not be changed and the processing quality will not be affected. The detailed configurations of the second wire-distributing module 400 and the wire group 100 will be described in the following paragraphs with FIG. 10 and FIG. 11.

Moreover, the detailed structures between the second wire-distributing member 410 and the second aligning-coupling portion are similar to the first wire-distributing module 300. For example, a pre-cut groove is disposed between the second wire-distributing tube 449 on the left and the second aligning-coupling portion 420. That is, the end 411 may include the pre-cut groove 413 for the remove of the second aligning-coupling portion 420 of the assembled wire module 10. Similarly, a pre-cut groove is disposed between the second wire-distributing tube 450 on the right and the second aligning-coupling portion 430. That is, the end 412 may include the pre-cut groove 414 for the remove of the second aligning-coupling portion 430 of the assembled wire module 10.

In addition, the second wire-distributing module 400 is provided with a positioning groove on the surface opposite to the adhesive injection hole. That is, one side of the second wire-distributing member 410 is provided with a positioning groove toward the positive Z-axis. For example, a region of the left end 411 of the top surface of the second wire-distributing module 400 is provided with a positioning groove 415, and a region of the right end 412 of the top surface of the second wire-distributing module 400 is provided with a positioning groove 416. The positioning groove 415 and the positioning groove 416 are used to fix the position of the aforementioned circuit board 500. When the aforementioned wire group 100 is soldered to the circuit board 500, the relative position between each wire and the circuit board 500 will not be changed and the processing quality will not be affected. The detailed configurations of the wire group 100, the second wire-distributing module 400, and the circuit board 500 will be described in the following paragraphs with FIG. 12 to FIG. 14.

Corresponding to the first wire-distributing module 300, the second aligning-coupling portion of the second wire-distributing module 400 is provided with an aligning hole to connect the first wire-distributing module 300 and the second wire-distributing module 400 to fix their positions relative to each other. For example, an aligning hole 470 is disposed on the surface of the second aligning-coupling portion 420 toward the first wire-distributing module 300, and the aligning hole 471 is disposed on the surface of the aligning-coupling portion 430 toward the first wire-distributing module 300. The assembly of the first wire-distributing module 300 and the second wire-distributing module 400 into the wire-distributing device 200 will be further described in FIG. 7 and FIG. 8.

Figure 7:
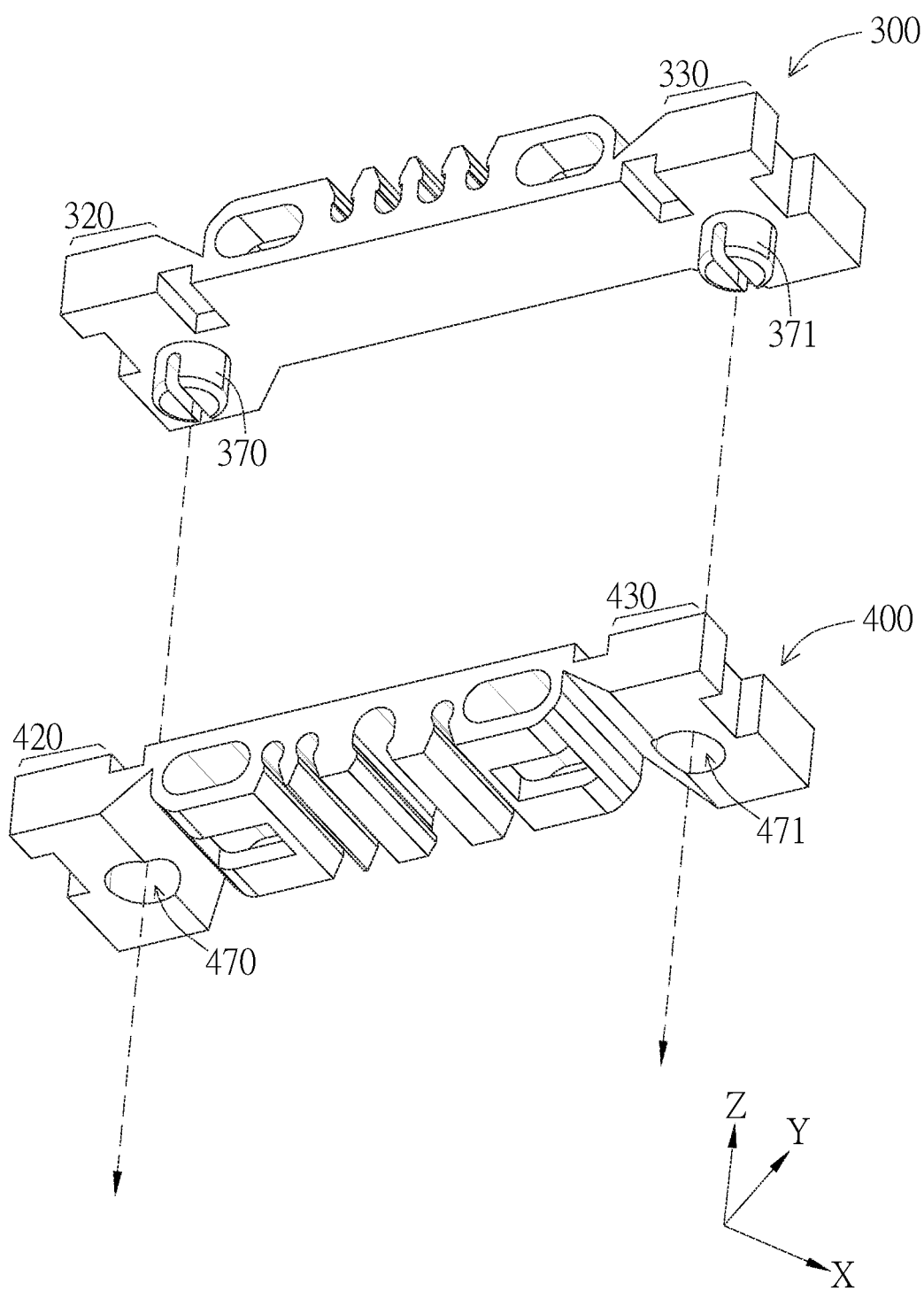
FIG. 7 is a three-dimensional schematic diagram of a first wire-distributing module and a second wire-distributing module before being assembled into a wire-distributing device according to an embodiment of the present invention.
Figure 8:
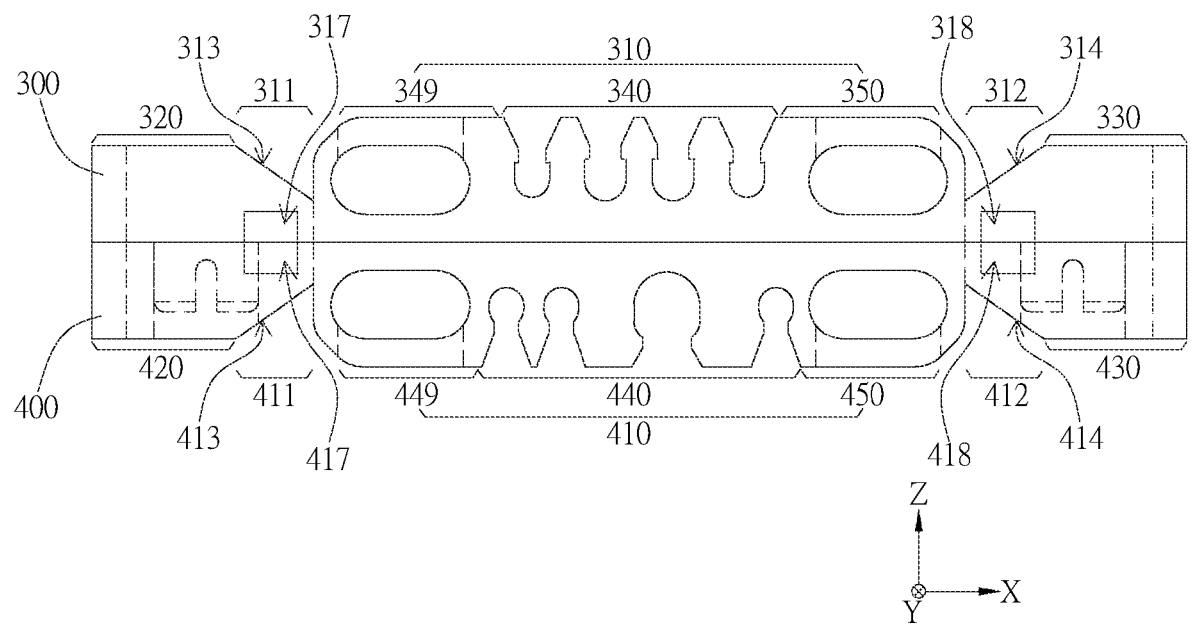
FIG. 8 is a schematic front view of the first wire-distributing module and a second wire-distributing module after being assembled into a wire-distributing device according to an embodiment of the present invention.

Referring to FIG. 7 and FIG. 8, FIG. 7 is a three-dimensional schematic diagram of the first wire-distributing module and a second wire-distributing before being assembled into a wire-distributing device according to an embodiment of the present invention, and FIG. 8 is a schematic front view of the first wire-distributing module and a second wire-distributing after being assembled into a wire-distributing device according to an embodiment of the present invention. It should be understood that FIG. 7 and FIG. 8 do not show all the elements that have been marked in FIG. 3 to FIG. 6 for the brevity of marking.

Referring to FIG. 3 to FIG. 8, an embodiment of the coupling portion 370 and the coupling portion 371 of the first wire-distributing module 300 can be implemented as a protruding structure, such as a cylinder as shown in FIG. 7. In contrast, the implementation of the alignment holes 470 and the alignment holes 471 of the second wire-distributing module 400 can be implemented as a structure having a shape corresponding to the coupling portion 370 and the coupling portion 371, such as a circular hole as shown in FIG. 7. When the first wire-distributing module 300 and the second wire-distributing module 400 are stacked along the Z-axis direction as shown in FIG. 7, the coupling portion 370 of the first aligning-coupling portion 320 is assembled with the alignment hole 470 of the second aligning-coupling portion 420 to fix their positions relative to each other. Similarly, the coupling portion 371 of the first aligning-coupling portion 330 is assembled with the alignment hole 471 of the second aligning-coupling portion 430 to fix their positions relative to each other, as shown in FIG. 8. It should be understood that the method of assembling the first wire-distributing module 300 and the second wire-distributing module 400 into the wire-distributing device 200 is not limited to the way of using the coupling portions and the alignment holes. For example, the first aligning-coupling portion may be directly bonded to the corresponding second aligning-coupling portion by an adhesive (not shown in the figure).

In FIG. 8, the first wire-distributing grooves 340 of the first wire-distributing member 310 and the second wire-distributing grooves 440 of the second wire-distributing member 410 are disposed on opposite surfaces, and the first wire-distributing grooves 340 and the second wire-distributing grooves 440 have different configurations. For example, the amounts of their wire-distributing grooves are different, the shapes of their wire-distributing grooves are not the same, or the positions of their wire-distributing grooves may not be aligned (for example, they may be staggered). The configurations of the wire-distributing grooves may be correspondingly adjusted according to the configurations of the wire group 100. Similarly, the configurations of the first wire-distributing tube of the first wire-distributing member and the second wire-distributing tube of the second wire-distributing member may be correspondingly adjusted according to the wire group 100.

When the first wire-distributing module 300 and the second wire-distributing module 400 are stacked to form the wire-distributing device 200, the left positioning groove 315 of the first wire-distributing module 300 as shown in FIG. 4 may be aligned with the left positioning groove 415 of the second wire-distributing module 400 as shown in FIG. 5 to form an opening 317 and an opening 417 that are communicating directly, as shown in FIG. 8. Similarly, the right positioning groove 316 of the first wire-distributing module 300 as shown in FIG. 4 may be aligned with the right positioning groove 416 of the second wire-distributing module 400 as shown in FIG. 5 to form an opening 318 and an opening 418 that are communicating directly. Therefore, opening 317, opening 417, opening 318, and opening 418 will prevent the relative positions of the wires and the circuit board 500 from shifting and affect the processing quality when the wire group 100 is soldered to the circuit board 500.

In addition, after the wire group 100 is fixed to the wire-distributing device 200 and the wire group 100 is soldered to the circuit board 500, depending on the size of the overall wire module 10, the first aligning-coupling portion 320 and the second aligning-coupling portion 420 may be selectively peeled off, twisted off, cut or sheared to reduce the width of the wire module 10. Similarly, the first aligning-coupling portion 330 and the second aligning-coupling portion 430 may be peeled off, twisted off, cut, or sheared to reduce the width of the wire module 10 as described in the following FIG. 9.

Figure 9:
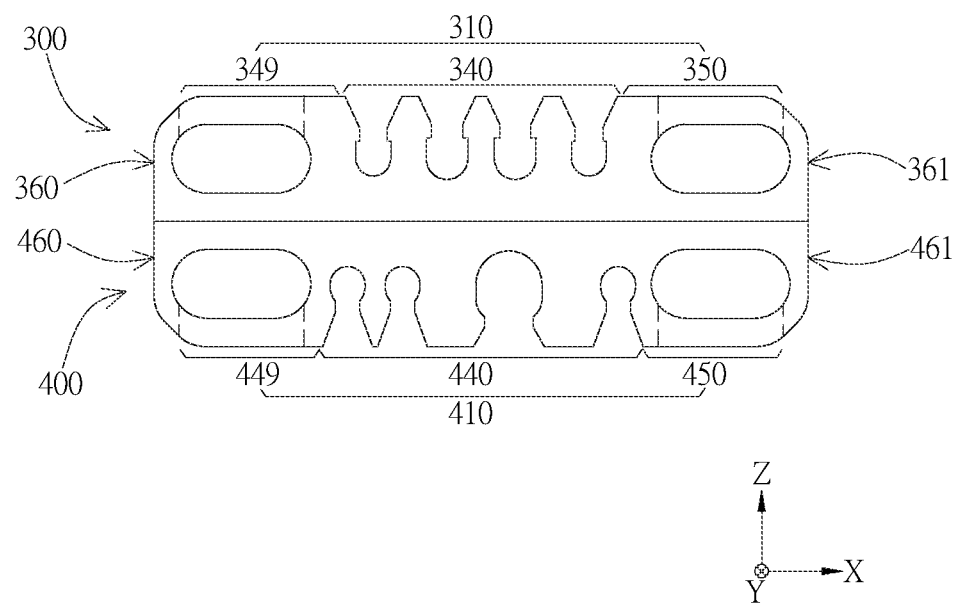
FIG. 9 is a schematic front view of a first wire-distributing module and a second wire-distributing module after being assembled into a wire-distributing device with a first aligning-coupling portion and a second aligning-coupling portion removed according to an embodiment of the present invention.

Referring to FIG. 9, FIG. 9 is a schematic front view of a first wire-distributing module and a second wire-distributing module after being assembled into a wire-distributing device and a first aligning-coupling portion with a second aligning-coupling portion removed according to an embodiment of the present invention. The difference between FIG. 9 and FIG. 8 is that FIG. 9 is another variational embodiment of FIG. 8. In FIG. 9, the first sectional surface 360, the first sectional surface 361, the second sectional surface 460, and the second sectional surface 461 represent the exposed sectional surfaces after the first aligning-coupling portion 320, the first aligning-coupling portion 330, the second aligning-coupling portion 420 and the second aligning-coupling portion 430 are removed. The first sectional surface 360 and the corresponding second sectional surface 460 are located on the same side, and the two sectional surfaces may be arranged flush, side by side, front and back, or in other ways. There may be a gap between the two sectional surfaces or they may be connected. Similarly, the first sectional surface 361 and the corresponding second sectional surface 461 are located on the same side, and the two sectional surfaces may be arranged flush, side by side, front and back, or in other ways. There may be a gap between the two sectional surfaces or they may be connected.

Furthermore, the remove of the first aligning-coupling portion 320, the first aligning-coupling portion 330, the second aligning-coupling portion 420 and the second aligning-coupling portion 430 are preferably performed at the pre-cut groove 313, the pre-cut groove 314, the pre-cut groove 413 and the pre-cut groove 414. In other words, the positions of the first sectional surface 360, the first sectional surface 361, the second sectional surface 460 and the second sectional surface 461 are respectively corresponding to the positions of the pre-cut groove 313, the pre-cut groove 314, the pre-cut groove 413 and the pre-cut groove 414.

For example, the first sectional surface 360, the first sectional surface 361, the second sectional surface 460, and the second sectional surface 461 are the relatively flat surfaces exposed at the two ends of the first wire-distributing module 300, and the second wire-distributing module 400 after removing the first aligning-coupling portion 320, the first aligning-coupling portion 330, the second aligning-coupling portion 420 and the second aligning-coupling portion 430 by using laser, cutting, shearing, twisting or other methods. Alternatively, the first sectional surface 360, the first sectional surface 361, the second sectional surface 460, and the second sectional surface 461 are the relatively uneven or irregular surfaces exposed at the two ends of the first wire-distributing module 300, and the second wire-distributing module 400 after removing the first aligning-coupling portion 320, the first aligning-coupling portion 330, the second aligning-coupling portion 420 and the second aligning-coupling portion 430.

Figure 10:
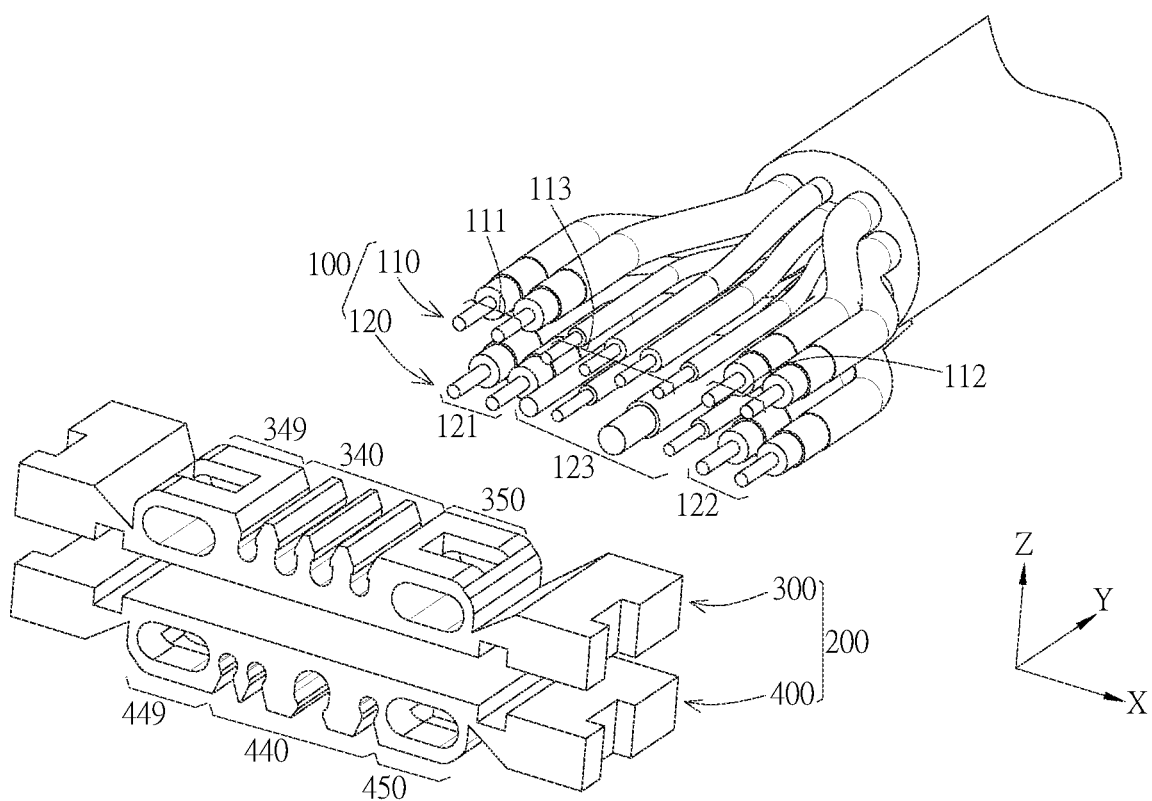
FIG. 10 is a three-dimensional schematic diagram of a wire-distributing device and a wire group before being assembled according to an embodiment of the present invention.
Figure 11:
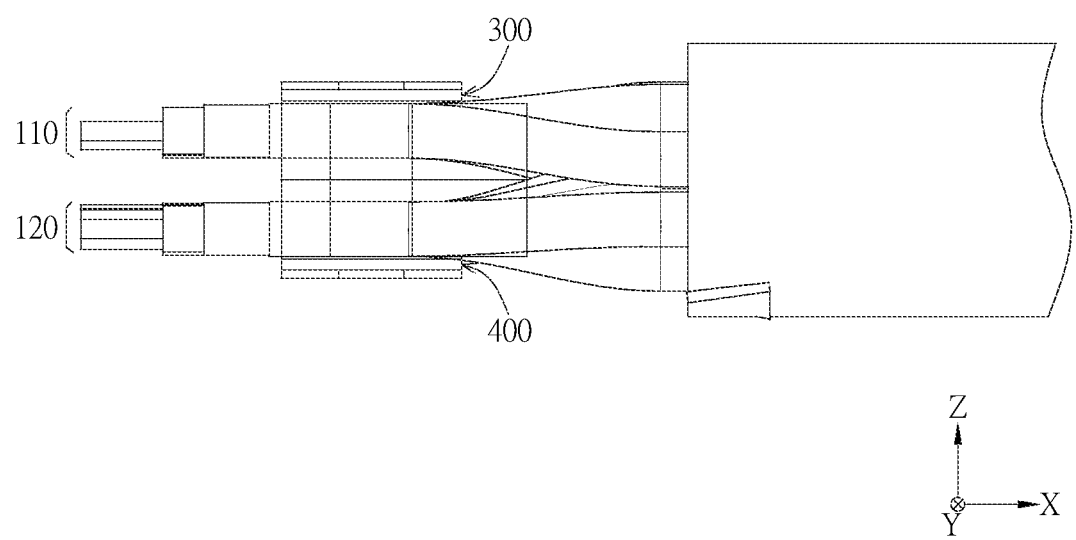
FIG. 11 is a three-dimensional schematic diagram of a wire-distributing device and a wire group after being assembled according to an embodiment of the present invention.

Referring to FIG. 10 and FIG. 11, FIG. 10 is a three-dimensional schematic diagram of a wire-distributing device and a wire group before being assembled according to an embodiment of the present invention, and FIG. 11 is a three-dimensional schematic diagram of a wire-distributing device and a wire group after being assembled according to an embodiment of the present invention. It should be understood that FIG. 10 and FIG. 11 do not show all the elements that have been marked in FIG. 3 to FIG. 6 for the brevity of marking.

In FIG. 10, the plurality of wires of the wire group 100 may be sorted into an upper layer and a lower layer as the first part 110 of the wire group 100 and the second part 120 of the wire group 100. The first part 110 of the wire group 100 may be further sorted into different wire types, and positioned side by side in the first wire-distributing module 300. For example, the first part 110 of the wire group 100 is sorted into the data cables 111 on the left side, the data cables 112 on the right side, and the electronic cables 113 on the middle part. Similarly, in the second part, 120 of the wire group 100 is sorted into the data cables 121 on the left side, the data cables 122 on the right side and the electronic cables 123 on the middle part.

In FIG. 10, the data cable 111 and the data cable 121 of the wire group 100 may be respectively extended into the first wire-distributing tube 349 on the left and the second wire-distributing tube 449 on the left along the direction of the negative Y-axis, the electronic cables 113 and the electronic cables 123 may be respectively positioned side by side in the first wire-distributing grooves 340 and the second wire-distributing grooves 440, and the data cable 112 and the data cables 122 of the wire group 100 may be respectively extended into the first wire-distributing tube 350 on the right and the second wire-distributing tube 450 on the right. For the brevity of marking, the schematic three-dimensional diagram of the wire group 100 positioned in the wire-distributing device 200 may be referred to FIG. 2, and the schematic side view may be referred to FIG. 11.

It should be noted that the first part 110 and the second part 120 of the wire group 100 may be respectively pre-treated by laser to remove the outer layers first, and then the first wire-distributing module 300 and the second wire-distributing module 400 are assembled to form the wire-distributing device 200. The technical problems of unstable processing quality caused by the smaller pitch of the adjacent wires may then be improved.

Figure 12:
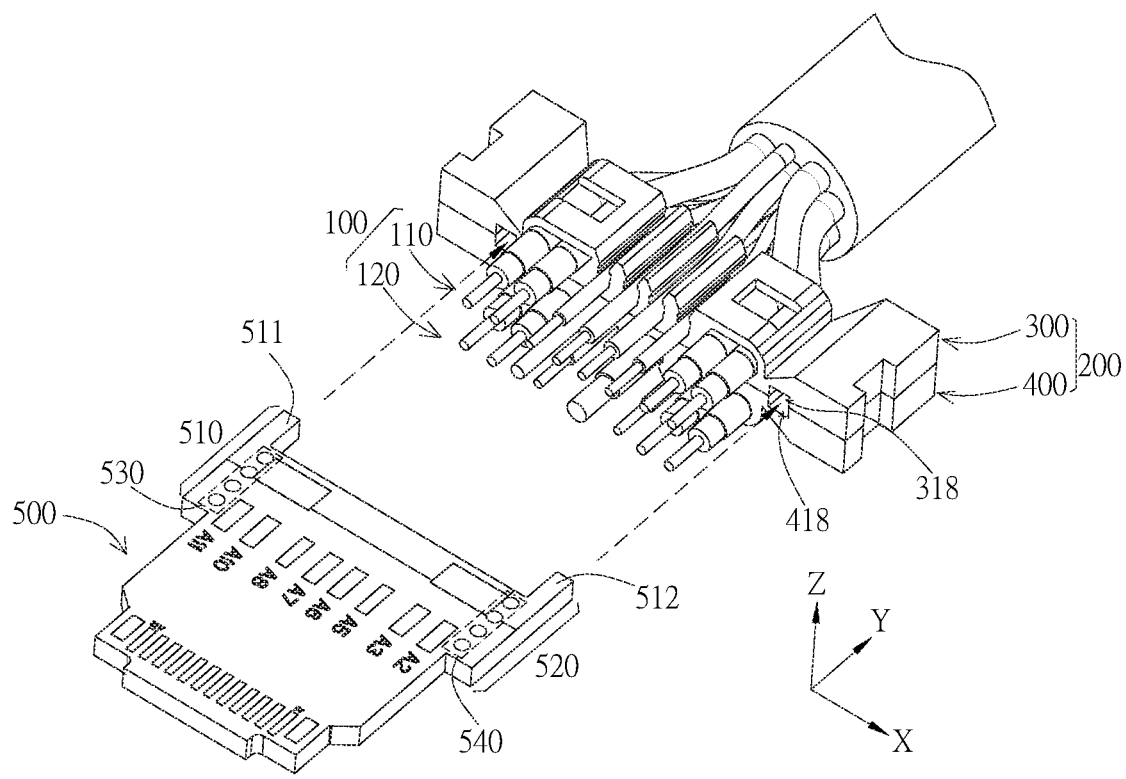
FIG. 12 is a three-dimensional schematic diagram of a wire-distributing device, a wire group, and a circuit board before being assembled according to an embodiment of the present invention.
Figure 13:
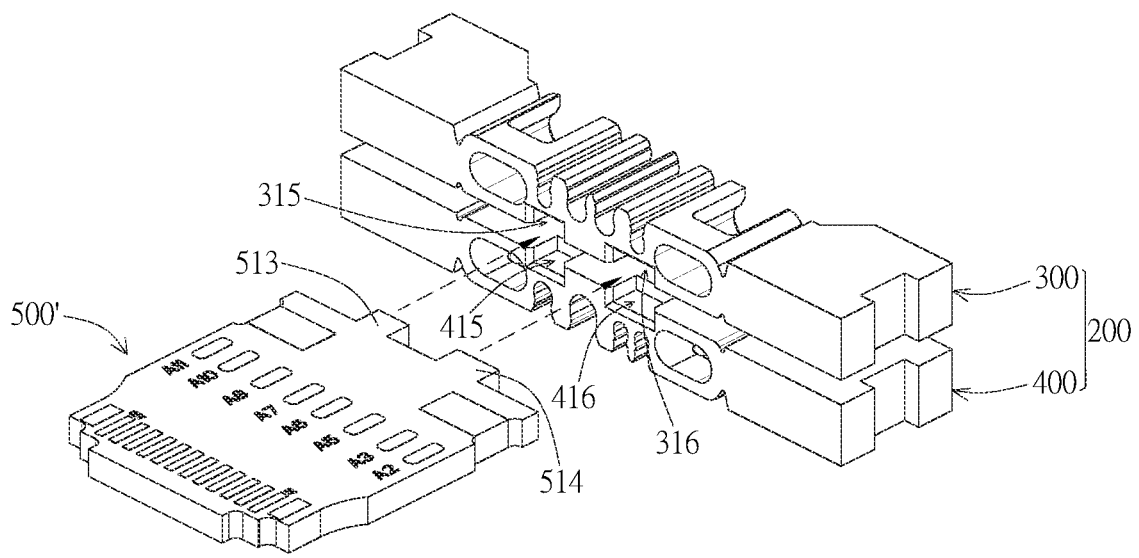
FIG. 13 is a three-dimensional schematic diagram of a wire-distributing device and a circuit board according to another embodiment of the present invention.
Figure 14:
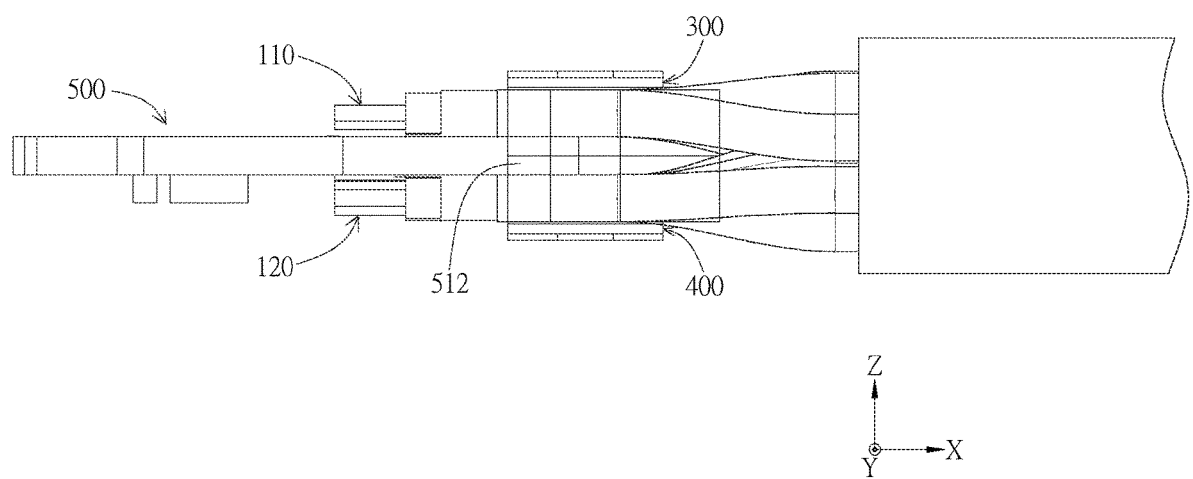
FIG. 14 is a schematic side view of a wire-distributing device, a wire group, and a circuit board after being assembled according to an embodiment of the present invention.

Referring to FIG. 12 to FIG. 14, FIG. 12 is a three-dimensional schematic diagram of a wire-distributing device, a wire group, and a circuit board before being assembled according to an embodiment of the present invention, FIG. 13 is a three-dimensional schematic diagram of a wire-distributing device and a circuit board according to another embodiment of the present invention, and FIG. 14 is a schematic side view of a wire-distributing device, a wire group, and a circuit board after being assembled according to an embodiment of the present invention. It should be understood that FIG. 12 to FIG. 14 do not show all the elements that have been marked in FIG. 3 to FIG. 6 for the brevity of marking.

In FIG. 12, The circuit board 500 includes a left connecting end 510 and a right connecting end 520. The connecting end 510 has a protruding positioning portion 511 at the front end, and the connecting end 520 has a protruding positioning portion 512 at the front end. For example, an embodiment of the positioning portion 511 and the positioning portion 512 may be in the form of a plug shape as shown in FIG. 12. In FIG. 12, the right positioning portion 512 of the circuit board 500 may be inserted into the space formed by the positioning groove 316 and the positioning groove 416 from the right opening 318 and the right opening 418 of the wire-distributing device 200 along the positive Y-axis direction to fix the positions of the circuit board 500 and the wire-distributing device 200 relative to each other. Furthermore, the circuit board 500 is positioned between the first part 110 of wire group 100 and the second part 120 of wire group 100. Similarly, the left positioning portion 511 of the circuit board 500 fixes the positions of the wire group 100 and the wire-distributing device 200 relative to each other in the same manner, and the details are not repeated here.

Moreover, after positioning the circuit board 500 on the wire-distributing module, the connecting end 510 and the connecting end 520 of the circuit board 500 may be removed together with the positioning portion 511 and the positioning portion 512, to reduce the width of the wire module 10. In this embodiment, a row of holes 530 and a row of holes 540 are respectively disposed between the connecting end 510 and the connecting end 520 of the circuit board 500 and the main body of the circuit board 500 as pre-splitting paths. The rows of holes serving as the pre-splitting path are preferably aligned or collinear with the pre-cut groove 313 and the pre-cut groove 413. When the first aligning-coupling portion 320, the first aligning-coupling portion 330, the second aligning-coupling portion 420, and the second aligning-coupling portion 430 are respectively removed from the pre-cut groove 313 and the pre-cut groove 314, the connecting end 510 and the connecting end 520 may be respectively peeled off, cut or sheared together with the positioning portion 511 and the positioning portion 512 along the row of holes. For the brevity of marking, the schematic diagram of the relative positions between the assembled circuit board 500, wire group 100, and wire-distributing device 200 may be referred to FIG. 2, and their side view may be referred to FIG. 14.

In another embodiment, the configuration method of the positioning portions of the circuit board may be further implemented in different methods. As shown in FIG. 13, the positioning portion 513 and the positioning portion 514 of the circuit board 500' may be configured on locations other than the two ends of the circuit board 500', such as locations close to the middle region. Moreover, the corresponding positioning groove 315, positioning groove 316, positioning groove 415, and positioning groove 416 are provided on the wire-distributing device 200 to fix the positions of the circuit board 500' and the wire-distributing device 200 relative to each other. In this configuration, the circuit board 500' may not be processed with the actions of peeling off, cutting, or shearing when the first aligning-coupling portion 320, the first aligning-coupling portion 330, the second aligning-coupling portion 420 and the second aligning-coupling portion 430 are removed.

An embodiment of the present invention also provides a manufacturing method for a wire module. Referring to FIG. 15, FIG. 15 is a schematic flowchart of a manufacturing method of a wire module according to an embodiment of the present invention. As shown in flowchart 900, at step S910, the wire group 100 may be first sorted into the first part 110, and the second part 120, as shown in FIG. 10.

At step S920, the first part 110 of the wire group 100 is fixed to the first wire-distributing module 300. For example, data cable 111 and data cable 112 of the first part 110 of the wire group 100 are fixed to the first wire-distributing tube 349 and the first wire-distributing 350 of the first wire-distributing module 300 by adhesive. Furthermore, the electronic cables 113 of the first part 110 of the wire group 100 may be positioned side by side in the first wire-distributing grooves 340 of the first wire-distributing module 300, as shown in FIG. 8, FIG. 10, and FIG. 11. Similarly, the method of fixing the second part 120 of the wire group 100 to the second wire-distributing module 400 is similar to fixing the first part 110 of the wire group 100 to the first wire-distributing module 300, and the details are not repeated here.

At step 930, the first wire-distributing module 300 and the second wire-distributing module 400 are assembled to form the wire-distributing device 200. The assembling method may combine the coupling portion 370 and the coupling 371 respectively disposed on the first aligning-coupling portion 320 and the first aligning-coupling portion 330 of the two ends of the first wire-distributing module 300 with the aligning hole 470 and the aligning hole 471 respectively disposed on the second aligning-coupling portion 420 and the second aligning-coupling portion 430 of the two ends of the second wire-distributing module 400. Then the first wire-distributing module 300 and the second wire-distributing module 400 are assembled to form the wire-distributing device 200, as shown in FIG. 3 to FIG. 8. Alternatively, the first aligning-coupling portion 320 and the first aligning-coupling portion 330 of the two ends of the first wire-distributing module 300 may be fixed to the second aligning-coupling portion 420 and the second aligning-coupling portion 430 of the two ends of the second wire-distributing module 400 by an adhesive.

At step S940, the first part 110 of the wire group 100 may be soldered to one side of the circuit board 500, and the second part 120 of the wire group 100 may be soldered to the side of the circuit board 500 opposite to the side of the first part 110 of the wire group 100, as shown in FIG. 2, FIG. 12 to FIG. 14. Furthermore, the wire connector 800 is soldered to the circuit board 500. Finally, wire module 10 is formed after the upper housing 600 and the lower housing 700 are assembled.

At step S950, after the first part 110 of the wire group 100 and the second part 120 of the wire group 100 are soldered to the circuit board 500, depending on the size of the wire module 10, it can be determined whether to remove (e.g., to peel off, cut or shear) the first aligning-coupling portion 320, first aligning-coupling portion 330, the second aligning-coupling portion 420 and the second aligning-coupling portion 430 of the two ends of the wire module 10 together with the positioning portion 511 and the positioning portion 512 of the circuit board 500 for fixing the relative positions of the wire group 100, the wire-distributing device 200 and the circuit board 500, to expose the corresponding sectional surfaces, such as the first sectional surface 360, the first sectional surface 361, the second sectional surface 460 and the second sectional surface 461 shown in FIG. 9.

Although the preferred embodiments of the invention have been described herein, the above description is merely illustrative. The preferred embodiments disclosed will not limit the scope of the present invention. Further modification of the invention herein disclosed will occur to those skilled in the respective arts and all such modifications are deemed to be within the scope of the invention as defined by the appended claims.

What is claimed is:

1. A wire module, comprising:
   a wire group having a plurality of wires; and
   a wire-distributing device, comprising:
      a first wire-distributing module having a first wire-distributing member and at least one first aligning-coupling portion connected to one end of the first wire-distributing member, wherein a first part of the plurality of wires is positioned side by side on the first wire-distributing member; and
      a second wire-distributing module having a second wire-distributing member and at least one second aligning-coupling portion connected to one end of the second wire-distributing member, wherein a second part of the plurality of wires is positioned side by side on the second wire-distributing member,
   wherein the first wire-distributing module is stacked on the second wire-distributing module, and the first wire distribution member and the second wire distribution member are relatively positioned by correspondingly combining the first aligning-coupling portion and the second aligning-coupling portion.

2. The wire module of claim 1, wherein a pre-cut groove is disposed between the first wire-distributing member and the connected first aligning-coupling member, and a pre-cut groove is disposed between the second wire-distributing member and the connected second aligning-coupling member.

3. The wire module of claim 1, wherein the first wire-distributing member comprises a plurality of first wire-distributing grooves, and the second wire-distributing member comprises a plurality of second wire-distributing grooves; wherein the plurality of first wire-distributing grooves and the plurality of second wire-distributing grooves are respectively disposed on opposite surfaces of the first wire-distributing member and the second wire-distributing member.

4. The wire module of claim 3, wherein when the first wire-distributing module and the second wire-distributing module form the wire-distributing device, the plurality of the first wire-distributing grooves and the plurality of second wire-distributing grooves comprise a configuration that is not aligned with each other.

5. The wire module of claim 1, wherein the first wire-distributing member comprises at least one first wire-distributing tube for at least one wire to pass therethrough, and the first wire-distributing tube has an adhesive injection hole and an adhesive connecting the wire via the adhesive injection hole.

6. The wire module of claim 5, wherein the first wire-distributing member comprises at least one first wire-distributing groove, and the first wire-distributing tube is located between at least one first wire-distributing groove and the first aligning-coupling portion.

7. The wire module of claim 6, wherein the plurality of wires comprises an electronic cable and a data cable, the electronic cable is positioned in the first wire-distributing groove, and the data cable is positioned in the first wire-distributing tube.

8. The wire module of claim 6, further comprising:
   a circuit board partially located between the first part and the second part of the plurality of wires, wherein the circuit board has a connecting end toward the wire-distributing device, and the connecting portion protrudes to form at least one positioning portion, wherein a surface of the first wire-distributing member has a positioning groove toward the second wire-distributing member, and the positioning groove has an opening toward the circuit board, and the positioning portion extends from the opening into the positioning groove.

9. A wire module, comprising:
a wire group having a plurality of wires; and
a wire-distributing device, comprising:
   a first wire-distributing module having a first wire-distributing member and a first sectional surface located on a surface of one end of the first wire-distributing member, wherein a first part of the plurality of wires is positioned side by side on the first wire-distributing member; and
   a second wire-distributing module having a second wire-distributing member and a second sectional surface located on a surface of one end of the second wire-distributing member, wherein a second part of the plurality of wires is positioned side by side on the second wire-distributing member;
wherein the first wire-distributing module is stacked on the second wire-distributing module, and the first sectional surface and the second sectional surface are correspondingly located on the same side.

10. The wire module of claim 9, wherein the first wire-distributing member comprises a plurality of first wire-distributing grooves, and the second wire-distributing member comprises a plurality of second wire-distributing grooves; wherein the plurality of first wire-distributing grooves and the plurality of second wire-distributing grooves are respectively disposed on opposite surfaces of the first wire-distributing member and the second wire-distributing member.

11. The wire module of claim 9, wherein the first wire-distributing member comprises at least one first wire-distributing tube for at least one wire to pass therethrough, and the first wire-distributing tube has an adhesive injection hole and an adhesive connecting the wire via the adhesive injection hole.

12. The wire module of claim 11, wherein the first wire-distributing member comprises at least one first wire-distributing groove, and the first wire-distributing tube is located between at least one first wire-distributing groove and the first sectional surface.

13. The wire module of claim 11, wherein the plurality of wires comprises an electronic cable and a data cable, the electronic cable is positioned in the first wire-distributing groove, and the data cable is positioned in the first wire-distributing tube.

14. A manufacturing method of a wire module, comprising:
sorting a plurality of wires into a first part and a second part;
fixing the first part of the plurality of wires to a first wire-distributing module, and fixing the second part of the plurality of wires to a second wire-distributing module, wherein one end of the first wire-distributing module has at least one first aligning-coupling portion, and one end of the second wire-distributing module has at least one second aligning-coupling portion; and
forming the wire module with the first wire-distributing module and the second wire-distributing module, wherein the first aligning-coupling portion is correspondingly combined with the second aligning-coupling portion to position a relative location of the first wire-distributing module and the second wire-distributing module.

15. The manufacturing method of claim 14, wherein fixing the first part of the plurality of wires comprises:
fixing at least one of the first part of the plurality of wires to a first wire-distributing tube of the first wire-distributing module by an adhesive.

16. The manufacturing method of claim 14, wherein fixing the first part of the plurality of wires comprises:
fixing at least one of the first part of the plurality of wires to a first wire-distributing groove of the first wire-distributing module.

17. The manufacturing method of claim 14, wherein forming the wire module with the first wire-distributing module and the second wire-distributing module comprises:
respectively fixing at least one first aligning-coupling portion of the first wire-distributing module with the at least one second aligning-coupling portion of the second wire-distributing module by an adhesive.

18. The manufacturing method of claim 14, wherein forming the wire module with the first wire-distributing module and the second wire-distributing module comprises:
disposing of a coupling portion on the first aligning-coupling portion; and
disposing of an aligning hole on the second aligning-coupling portion, and the coupling portion is correspondingly assembled with the aligning hole.

19. The manufacturing method of claim 14, further comprising:
soldering the first part and the second part of the plurality of wires to a circuit board.

20. The manufacturing method of claim 19, wherein after soldering the first part and the second part of the plurality of wires to the circuit board, the first aligning-coupling portion and the second aligning-coupling portion are selectively removed to expose a corresponding sectional surface.

* * * * *